United States Patent
Aleshin et al.

(10) Patent No.: US 6,263,299 B1
(45) Date of Patent: *Jul. 17, 2001

(54) GEOMETRIC AERIAL IMAGE SIMULATION

(75) Inventors: Stanislav V. Aleshin; Evgenij Egorov; Genadij V. Belokopitov, all of Moscow (RU); Dusan Petranovic, Cupertino, CA (US)

(73) Assignee: LSI Logic Corporation, Milpitas, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/234,422

(22) Filed: Jan. 19, 1999

(51) Int. Cl.$^7$ .................................................. G06G 7/48
(52) U.S. Cl. ................... 703/5; 703/13; 716/19; 382/280
(58) Field of Search ................... 703/5, 13; 716/19; 382/280; 430/5, 30, 31

(56) References Cited

U.S. PATENT DOCUMENTS

| | | | |
|---|---|---|---|
| 4,652,134 | 3/1987 | Pasch et al. | 356/401 |
| 5,444,265 | 8/1995 | Hamilton | 250/559.42 |
| 5,502,654 | * 3/1996 | Sawahata | 382/280 |
| 5,595,861 | 1/1997 | Garza | 430/510 |
| 5,663,076 | 9/1997 | Rostoker | 438/14 |
| 5,679,598 | 10/1997 | Yee | 437/60 |
| 5,682,323 | 10/1997 | Pasch et al. | 716/19 |
| 5,705,301 | 1/1998 | Garza | 430/5 |
| 5,723,233 | 3/1998 | Garza et al. | 430/5 |
| 5,877,045 | 3/1999 | Kapoor | 438/151 |
| 5,900,338 | 5/1999 | Garza et al. | 430/5 |
| 5,955,227 | * 9/1999 | Tsujita | 430/30 |
| 5,998,070 | * 12/1999 | Lee | 430/5 |

OTHER PUBLICATIONS

Qian et al, "A New Scalar Planewave Model for High NA Lithography Simulations", IEEE International Workshop on Numerical Modeling of Processes and Devices for Integrated Circuits, pp. 45–48, Jun. 1994.*

H.H. Hopkins, "On the Diffraction Theory of Optical Images," Proc. Roy. Soc. Ser.A 217, pp. 408–432, London, 1953.

D. Cole et al., "Extending Scalar Aerial Image Calculations to Higher Numerical Aperture," J. Vac. Sci. Technol. B B 10(6), pp. 3037–3041, 1992.

M. Born et al., "Principles of Optics," Sixth Edition, Cambridge University Press, pp. 121–124, 167–169, 518–526, 1997.

M.S. Yeung, "Modeling High Numerical Aperture Optical Lithography," Proc. SPIE 922, pp. 149–167, 1988.

M. Abramowitz et al, "Handbook of Mathematical Functions with Formulas, Graphs and Mathematical Tables," National Bureau of Standards Applied Mathematics, Series 55, pp. 231–233, pp. 916–917, Issued Jun. 1964.

A. Lowan et al., "Table of the Zeros of the Legendre Polynomials of Order 1–16 and the Weight of Coefficients for Gauss Mechanical Quadrature Formula," Bull, Am. Math. Soc., pp. 739–743, 1942, V48.

A. Lowan et al., "Errata to Table of the Zeros of the Legendre Polynomials of Order 1–16 and the Weight Coefficients for Gauss' Mechanical Quadrature Formula," Am. Math. Soc., p. 939, p. 950, 1943, V49.

* cited by examiner

Primary Examiner—Kevin J. Teska
Assistant Examiner—Samuel Broda

(57) ABSTRACT

An aerial image produced by a mask having transmissive portions is simulated by dividing the transmissive portions of the mask into primitive elements, obtaining a response for each of the primitive elements, and then simulating the aerial image by combining the responses over all of the primitive elements.

29 Claims, 7 Drawing Sheets

GEOMETRIC AERIAL IMAGE SIMULATION

BACKGROUND OF THE INVENTION

1. Field of the Invention

The present invention relates to simulation of an aerial image, and particularly relates to simulation of an aerial image produced by a mask to be used in patterning an integrated circuit (IC) chip during semiconductor wafer fabrication.

2. Description of the Related Art

A. Wafer Construction

Photolithography is a common technique employed in the manufacture of semiconductor devices. Typically, a semiconductor wafer is coated with a layer (film) of light-sensitive material, such as photoresist. Using a patterned mask or reticle, the wafer is exposed to projected light, typically actinic light, which manifests a photochemical effect on the photoresist, which is subsequently chemically etched, leaving a pattern of photoresist "lines" on the wafer corresponding to the pattern on the mask.

A "wafer" is a thin piece of semiconductor material from which semiconductorchips are made. The four basic operations utilized to fabricate wafers include (1) layering, (2) patterning, (3) doping and (4) heat treatments.

The layering operation adds thin layers of material, including insulators, semiconductors, and conductors, to a wafer surface. During the layering operation, layers are either grown or deposited. Oxidation involves growing a silicon dioxide (an insulator) layer on a silicon wafer. Deposition techniques include, for example, chemical vapor deposition, evaporation, and sputtering. Semiconductors are generally deposited by chemical vapor deposition, while conductors are generally deposited with evaporation or sputtering.

Patterning involves the removal of selected portions of surface layers. After material is removed, the wafer surface has a pattern. The material removed may form a hole or an island. The process of patterning is also known to those skilled in the relevant art as microlithography, photolithography, photomasking and masking. The patterning operation serves to create parts of the semiconductor device on the wafer surface in the dimensions required by the circuit design and to locate the parts in their proper location on the wafer surface.

Doping involves implanting dopants in the surface of the wafer through openings in the layers to create the n-type and p-type pockets needed to form the N-P junctions for operation of discrete elements such as transistors and diodes. Doping is generally achieved with thermal diffusion (the wafer is heated and exposed to the desired dopant) and ion implantation (dopant atoms are ionized, accelerated to high velocities and implanted into the wafer surface).

Construction of semiconductor wafers with these steps is well known in the art of semiconductor fabrication. Examples of wafer construction processes are described in U.S. Pat. No. 5,679,598 issued to Yee on Oct. 21, 1997, entitled "Method of Making a CMOS Dynamic Random-Access Memory (DRAM)," U.S. Pat. No. 5,663,076 issued to Rostoker et al. on Sep. 2, 1997, entitled "Automating Photolithography in the Fabrication of Integrated Circuits," U.S. Pat. No. 5,595,861 issued to Garza on Jan. 21, 1997, entitled "Method of Selecting and Applying a Top Antireflective Coating of a Partially Fluorinated Compound," U.S. Pat. No. 5,444,265 issued to Hamilton on Aug. 22, 1995, entitled "Method and Apparatus for Detecting Defective Semiconductor Wafers During Fabrication Thereof," and U.S. Pat. No. 4,652,134 issued to Pasch et al. on Mar. 24,1987, entitled "Mask Alignment System." The specifications of these five patents identified in this paragraph are hereby incorporated herein as though set forth in full by this reference.

B. Patterning And Proximity Effects

One of the most critical operations in wafer fabrication, patterning sets the dimensions of the electronic devices to be implemented on the IC chip. Errors in the patterning process can cause distortions that cause changes in the functions of these electronic devices.

Design rule limitations frequently are referred to as critical dimensions. A critical dimension of a circuit is commonly defined as the smallest width of a line or the smallest space between two lines. Consequently, the critical dimension determines the overall size and density of an IC. In present IC technology, the smallest critical dimension forstate-of-the-art circuits is 0.3 micron for line widths and spacings.

Once the layout of the circuit has been created, the next step to manufacturing the integrated circuit is to transfer the layout onto a semiconductor substrate. Photolithography is a well known process for transferring geometric shapes present on a mask onto the surface of a silicon wafer. In the field of IC lithographic processing, a photosensitive polymer film called photoresist is normally applied to a silicon substrate wafer and then allowed to dry. An exposure tool is utilized to expose the wafer with the proper geometrical patterns through a mask (or reticle) by means of a source of light or radiation. After exposure, the wafer is treated to develop the mask images transferred to the photosensitive material. These masking patterns are then used to create the device features of the circuit.

FIG. 1A is a functional block diagram illustrating a system for patterning an IC chip 26 using a mask 22. Referring to FIG. 1, light 21 is incident on mask 22 at a right angle. Such would be the case for a single point light source directly above mask 22 and far enough from mask 22 so that the wavefront at mask 22 would be approximately planar. It should, however, be noted that light 21 is shown in this manner for illustration purposes only. Generally, the light source will be an extended body consisting of many different points and, accordingly, light generally will strike mask 22 at many different angles. Thus, as shown in FIG. 1B, the light from points 31 and 32 on light source 30 will strike mask 35 at different angles.

Mask 22 includes transmissive and non-transmissive portions which effectively transmit and block light 21 so as to produce the desired pattern on IC chip 26. The light 23 exiting from mask 22 passes through optical system 24 and, finally, contacts IC chip 26, forming a light intensity pattern. Often, optical system 24 merely comprises the distance between mask 22 and IC chip 26. However, optical system 24 may include one or more lenses, mirrors and/or other optical elements.

An important limiting characteristic of the exposure tool is its resolution value. The resolution for an exposure tool is defined as the minimum feature that the exposure tool can repeatedly expose onto the wafer. Currently, the resolution for most advanced optical exposure tools is around 0.2 micron. Thus, the resolution value of present lithographic equipment is close to the critical dimension for most IC circuit designs. Consequently, the resolution of the exposure tool may influence the final size and density of the IC circuit. As the critical dimensions of the layout become smaller and approach the resolution value of the lithographic equipment, the consistency between the masked and actual layout pattern developed in the photoresist is significantly reduced. Specifically, it is observed that differences in pattern development of circuit features depends upon the proximity of the features to one another.

The magnitude of such proximity effects depends on the proximity or closeness of the two features present on the masking pattern. Proximity effects are known to result from optical diffraction in the projection system. This diffraction causes adjacent features to interact with one another in such a way as to produce pattern-dependent variations.

Proximity effects and methods for correcting for them (i.e., optical proximity correction, or OPC, methods) are discussed in U.S. Pat. No. 5,682,323 issued on Oct. 28, 1997, to Pasch et al. entitled "System and Method for Performing Optical Proximity Correction on Macrocell Libraries" (hereinafter the "Pasch '323 patent"). The specification of the Pasch '323 patent is incorporated herein as though set forth in full by this reference. The system and method described in the Pasch '323 patent performs optical proximity correction on an integrated circuit mask design by initially performing optical proximity correction on a library of cells that are used to create the IC. The pre-tested cells are imported onto a mask design. All cells are placed a minimum distance apart to ensure that no proximity effects will occur between elements fully integrated in different cells. An optical proximity correction technique is performed on the mask design by performing proximity correction only on those components, e.g., lines, that are not fully integrated within one cell.

Proximity effects and methods for correcting for them are also discussed in U.S. Pat. No. 5,705,301 issued on Jan. 6, 1998, to Garza et al. entitled "Performing Optical Proximity Correction with the Aid of Design Rule Checkers" (hereinafter the "Garza '301 patent"). The specification of the Garza '301 patent is incorporated herein as though set forth in full by this reference. The system described in the Garza '301 patent involves a method for identifying regions of an integrated circuit layout design where optical proximity correction will be most useful and then performing optical proximity correction on those regions only.

More specifically, the method includes the following steps: (a) analyzing an integrated circuit layout design with a design rule checker to locate features of the integrated circuit layout design meeting predefined criteria; and (b) performing optical proximity correction on the features meeting the criteria in order to generate a reticle design. The criteria employed by the design rule checker to select features include outside corners on patterns, inside corners on features, feature size, feature shape, and feature angles.

C. Mask Design

An overview of a technique for designing a mask will now be described with reference to the flow diagram shown in FIG. 2. Referring to FIG. 2, in step 42 an initial mask pattern is obtained. Generally, points in the initial mask pattern will have an amplitude of one where the pattern is supposed to appear on the chip and an amplitude of zero where no pattern is to appear on the chip. However, the initial mask pattern instead may be specified in other ways.

In step 44, an aerial image which would be produced by a mask having the mask pattern is simulated. Examples of conventional techniques for simulating an aerial image are described below.

In step 46, it is determined whether the simulated image is acceptable. Generally, the main criterion in making this determination is whether the simulated image has sufficient resolution to enable patterning which will result in error-free device fabrication. If the image is acceptable, then processing proceeds to step 48 in order to fabricate a mask having the designed pattern. Otherwise, processing proceeds to step 52.

In step 52, the mask pattern is altered, such as by adding and/or modifying serifs, in an attempt to improve the resolution of the aerial image. Such a process is described in more detail below. Upon completion of mask pattern alteration, processing returns to step 44 in order to simulate an aerial image based on the new mask pattern.

D. Proximity Effect Correction

A technique related to proximity effects involves the use of modified shapes or adjacent subresolution geometries to improve imaging. An example of this is the use of serifs on the corners of contacts. For contacts with dimensions near the resolution limit of the optics, a square pattern on the reticle will print more nearly as a circle. Additional geometries on the corners will help to square the corners of the contract. Such techniques often are called proximity correction. An example of such a technique is described in U.S. patent application Ser. No. 09/034,550 filed Mar. 3, 1998 and titled "Method And Apparatus For Application Of Proximity Correction With Relative Segmentation," which application is incorporated by reference herein as though set forth herein in full.

Proximity effects are a well-known phenomenon in electron beam lithography, where they result from electron scattering. In optical lithography proximity effects are caused by the phenomenon of diffraction. As a consequence of proximity effects, printed features do not have simple relationships to reticle dimensions. This creates a situation in which it is difficult to fabricate a photomask where the designer gets what he or she wants on the wafer.

Some limited form of proximity correction has been in use for at least two or three decades. These pattern modifications were usually requested by a wafer engineer based on knowledge of a particular process step. In recent years, proximity correction has become more of a science than an art due to the introduction of several proximity correction software programs. The proximity correction process consists of measuring several generic test patterns processed on a wafer and constructing a multilevel lookup table from the measured data.

E. Numerical Simulation of an Aerial Image

Lithographic simulators are becoming an important tool in the evaluation of optimal lithographic processing. Specifically, by simulating aerial images, the time required to design a mask often can be shortened. Simulators often are also useful for correcting optical proximity effects.

The aerial image produced by a mask, or the light intensity in an optical projection system's image plane, is a critically important quantity in microlithography for governing how well a developed photoresist structure replicates a mask design. The aerial image represents, to a large extent, the optical information about the mask that enters into the photoresist structure. Of course, the full calculation of the resist structure generally has to take into account other factors, such as propagation of light within the resist, exposure of the resist, any subsequent thermal or other such processes, and the dissolution of the resist. Nevertheless, the aerial image typically is the single most important predictor of mask printability.

The models used in conventional aerial image simulators are based either on scalar diffraction theory or vector diffraction theory. The models based on scalar theory usually follow the analysis of Hopkins. In Hopkins's analysis, light intensity is propagated through the optical system. The mask plane is treated as a partially coherent source surface, and a coherent transfer function describes how a point source in the mask plane is imaged in the plane of the resist. The aerial image (light intensity) at a point $\vec{r}_p$ is given as:

$$I(\vec{r}_p) = \int\int\int\int U(\vec{r}_{m1}) U(\vec{r}_{m2}) K(\vec{r}_{m1}, \vec{r}_p) K(\vec{r}_{m2}, \vec{r}_p) B(\vec{r}_{m1}, \vec{r}_{m2}) d\vec{r}_{m1} d\vec{r}_{m2} \quad (1)$$

where $\vec{r}_{m1}$ and $\vec{r}_{m2}$ points in the mask plane; $K(\vec{r}_{m1}, \vec{r}_p)$ is the coherent impulse response function of the optical system; $U(\vec{r}_{m1})$ is the mask complex transmission function; and $B(\vec{r}_{m1}, \vec{r}_{m2})$ is the mutual coherence function of the light at the mask plane.

If expression (1) is used for calculation of an aerial image at point $\vec{r}_p$, the number of operations required generally is on the order of $L^2$, where L is the number of points in the region of integration. It is noted that L generally determines the accuracy of the numerical integration of the integral in equation (1). In order to calculate the aerial image at a mesh with N nodes, the number of operations required generally is on the order of $NL^2$. Frequently, L is of the same order as N.

The second group of models (i.e., those based on vector diffraction theory) generally follow the work of Yeung, who traces vector electric fields through the optical system onto the photoresist surface. Specifically, each ray emanates from a particular source point and travels through a different portion of the mask and the optical system. One advantage of this method is the possibility of application of the Fast Fourier Transform (FFT) in the calculation of coherent images from each source point. The electric field at the resist surface due to that source point can be obtained by integration over the solid angles subtended by the optical system, and may be represented as:

$$I(\vec{r}_p) = \frac{1}{I_0} \int\int d\vec{r}_u I(\vec{r}_u) \left| \int\int d\vec{\rho} F_U(\vec{\rho}) H(|\vec{\rho} + \sigma\vec{r}_u|) \exp\{i 2\pi \partial \vec{\rho} \vec{r}_p\} \right|^2 \quad (2)$$

where $$F_U(\vec{\rho}) = \int\int U(\vec{r}_m) \exp\{-i 2\pi \partial M \vec{r}_m \vec{\rho}\} d\vec{r}_m \quad (3)$$

is the Fourier transform of the mask transmission function, $H(\vec{\rho})$ is the coherent transmission function of the optical system, $I(\vec{r}_u)$ is the intensity distribution at the source surface, and $I_0$ is the open frame intensity.

The aerial image calculation according to equation (2) thus consists of the following steps: (1) find the Fourier transform of the mask transmission function, which is called the spatial frequency spectrum of the mask; (2) multiply the spatial frequency spectrum of the mask by the coherent transmission function of the optical system, and repeat this step for each source point used in the calculation of the aerial image; (3) find the inverse Fourier transform of the function obtained in step (2); (4) multiply the result obtained in step (3) by its complex conjugate value; and (5) sum the coherent aerial images from all source points.

Steps (1) and (3) may be executed with the FFT algorithm. This calculation generally is the fastest way of obtaining the aerial image at a mesh having N nodes, because it typically only requires on the order of P(N+1)lgN operations, where P is the number of source points and typically is much smaller than N.

A variety of simulators are commercially available. Probably the most popular is Fast Aerial Image Model (FAIM), developed by Vector Technologies, Inc. and Princeton University. FAIM is capable of simulating segments of a computer-aided design (CAD) layout. It is generally uniform in accuracy and enables the user to simulate an aerial image of a segment (4×12 microns) in about 12 seconds on a 20 MFLOPS workstation.

As noted above, aerial image simulators are very important in OPC. In these applications, the simulator is required to be very fast because it is in a loop for performing an iterative correction procedure. Accordingly, improvements in the speed of such simulators are highly desirable, particularly when such simulators are used in OPC.

As noted above, Yeung's technique is relatively fast, because it can be executed using the FFT algorithm. However, Yeung's technique typically introduces additional errors into the simulation process. Specifically, prior to determining the FFT in step (1) above, the mask transmission function generally must first be rasterized. In this regard, the mask transmission function typically is initially represented in GDS2 format, which provides a geometric description of the mask pattern. Transformation into raster format is accomplished by sampling the mask pattern on a rectangular mesh. However, the mask transmission function generally is not analytical near polygon boundaries, and therefore the GDS2-to-raster transformation often introduces errors. In general, these areas become larger as the polygon dimensions become smaller.

An example of such errors is illustrated with reference to FIGS. 3A and 3B. Specifically, FIG. 3A illustrates a mask pattern 71 superimposed over a mesh 72. Mesh 72 includes regularly spaced nodes, such as nodes 74. Generally, rasterization is performed by determining whether a node is more or less than 50 percent occupied by transmissive portions of the mask pattern. If a particular node is more than 50 percent occupied by transmissive portions, the entire node is represented as transmissive. Otherwise, the entire node is represented as non-transmissive. Thus, FIG. 3B illustrates a patten 78 which results after rasterizing mask pattern 71. As seen by comparing FIGS. 3B and 3A, several errors have occurred during rasterization. In particular, pattern 78 is shifted to the left and upward as compared to pattern 74. In addition, the entire triangular portion 79 of pattern 74 has been eliminated in pattern 78.

The effects of rasterization error can be reduced by using a finer rasterization mesh. However, using a finer mesh also significantly increases the complexity of the required calculations by increasing the number of required operations. Thus, the conventional techniques typically require a trade-off between speed and accuracy.

What is needed, therefore, is a technique for aerial image simulation which can maintain high accuracy and which can be executed very quickly.

SUMMARY OF THE INVENTION

The present invention addresses the foregoing problems by simulating an aerial image produced by a mask by combining responses of various primitive elements that make up the mask.

Thus, according to one aspect, the invention simulates an aerial image produced by a mask having transmissive portions when the mask is exposed to a light source by dividing the transmissive portions of the mask into primitive elements. A response function is obtained for each of the primitive elements, and the response functions for all of the primitive elements are summed to obtain a mask response function. The aerial image is then simulated by evaluating the mask response function over all points in the light source.

According to a further aspect, the invention simulates an aerial image produced by a mask having transmissive portions when the mask is exposed to a light source by dividing the transmissive portions of the mask into primitive elements. A response is obtained for each of the primitive elements when the primitive element is exposed to a single point in the light source, and then the aerial image is simulated by combining the responses over all of the primitive elements and over all points in the light source.

According to a still further aspect, the invention simulates an aerial image produced by a mask having transmissive portions by dividing the transmissive portions of the mask into primitive elements, obtaining a response for each of the primitive elements, and then simulating the aerial image by combining the responses over all of the primitive elements.

By dividing mask transmissive portions into primitive elements, obtaining responses for those primitive elements, and then determining the overall mask response based on the responses from the primitive elements, the present invention often can avoid many of the problems with the prior art techniques. Specifically, the geometric aerial image simulation technique of the present invention generally can avoid the need to rasterize the mask pattern, thereby avoiding rasterization errors. At the same time, the present technique often can be performed relatively quickly. In this regard, in many instances the response of a primitive element can be found using only the vertices of the primitive element. In addition, if standard primitive elements are used, the primitive element responses can be pre-stored, thus further reducing the amount of time required to simulate an aerial image.

Finally, by utilizing a geometric aerial image simulation technique according to the present invention, it is often much easier to calculate light intensity only in a small arbitrarily selected portion of the image plane. Conventional techniques, by contrast, often use FFT-based algorithms which generally require simulation of the entire image plane. This can be a great advantage of the present technique, because it is frequently only desirable to know light intensity in certain selected portions of the image plane, such as near feature edges.

The foregoing summary is intended merely to provide a quick understanding of the general nature of the invention. A more complete understanding of the invention can be obtained by referring to the claims and the following detailed description of the preferred embodiments in connection with the accompanying figures.

DETAILED DESCRIPTION OF THE PREFERRED EMBODIMENT(S)

Figure 1A:
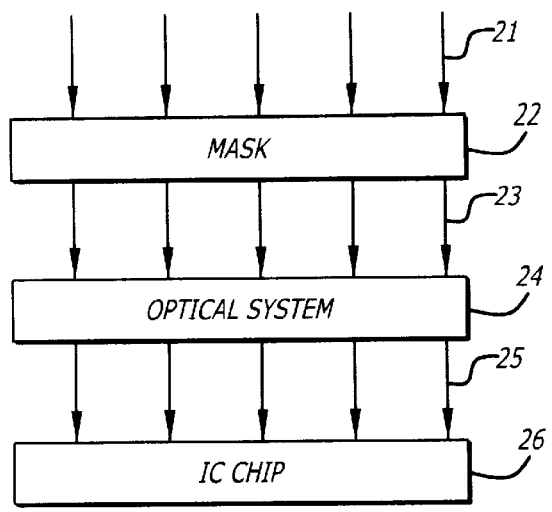
FIGS. 1A and 1B are functional block diagrams illustrating IC chip patterning.
Figure 1B:
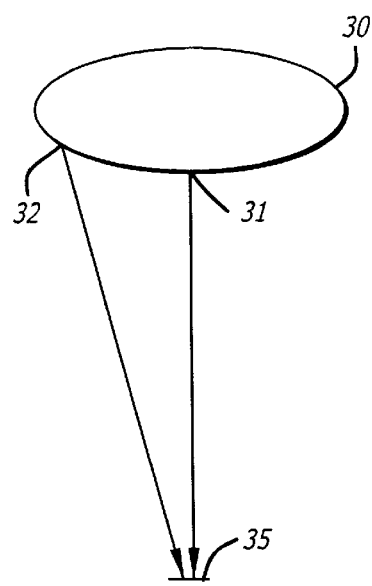
Figure 2:
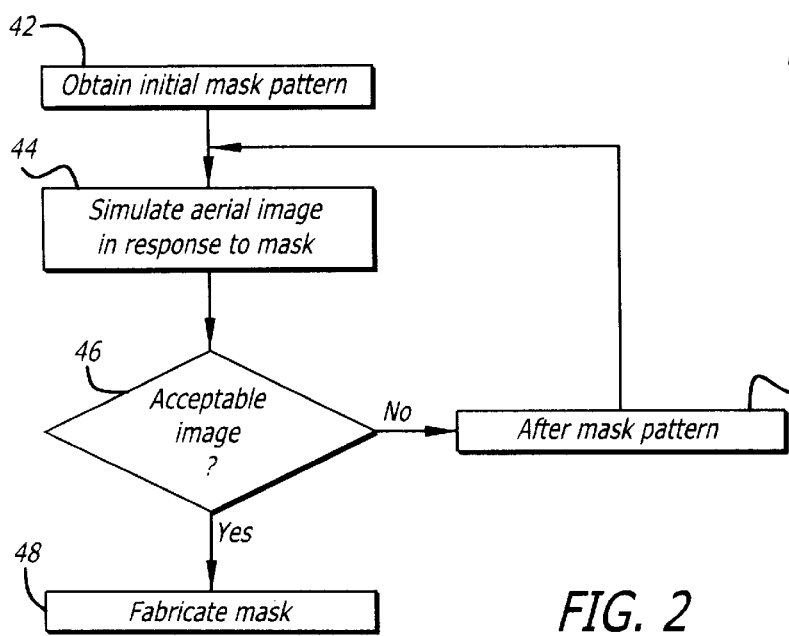
FIG. 2 is a flow diagram for explaining how to design a mask transmission function.
Figure 3A:
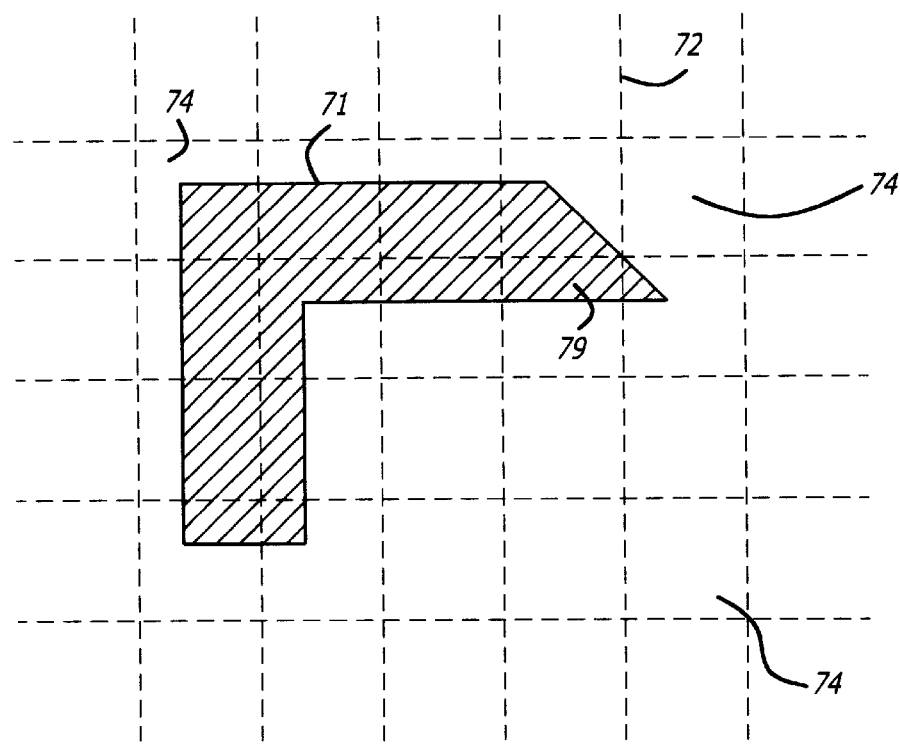
FIGS. 3A and 3B illustrate a conventional technique for simulating an aerial image.
Figure 3B:
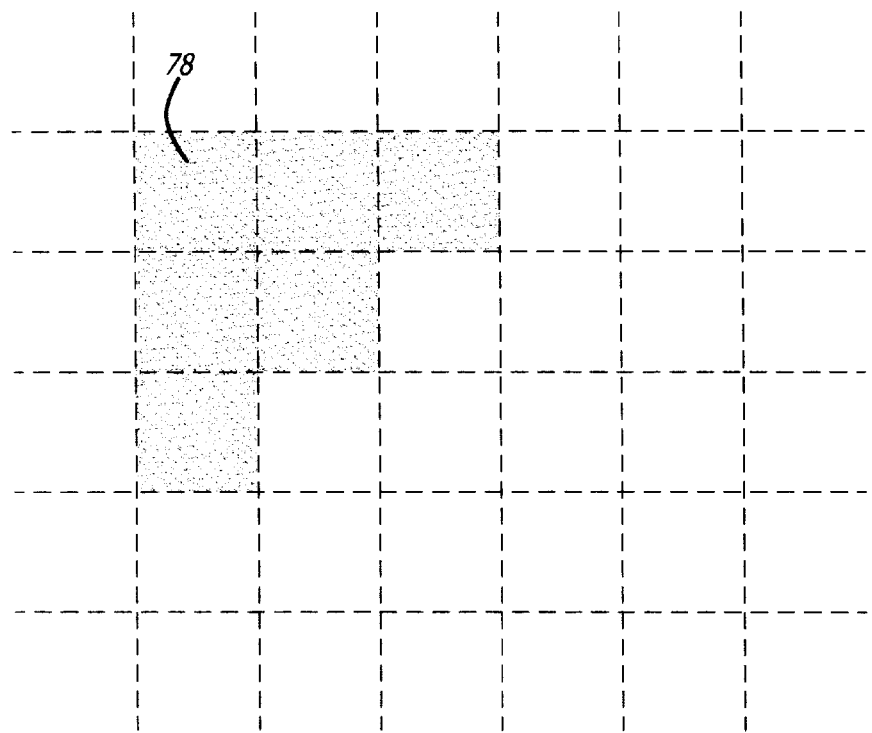

The following describes aerial image simulation techniques according to the present invention. Any of the following techniques may be utilized in mask design, such as to simulate an aerial image in step 44, as shown in FIG. 2.

A. Geometric Aerial Image Simulation

Figure 4:
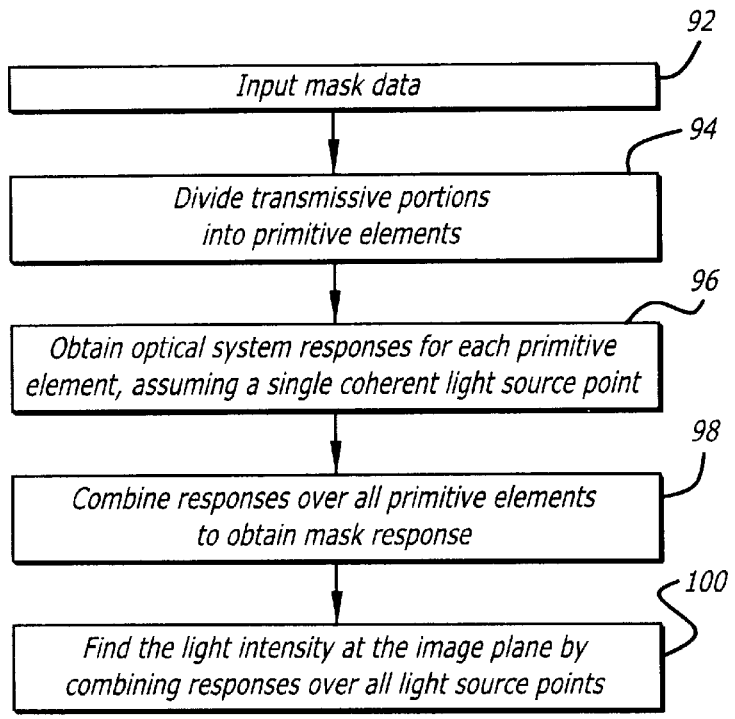
FIG. 4 is a flow diagram for explaining geometric aerial image simulation according to a preferred embodiment of the invention.

An embodiment of a geometric aerial image simulation technique according to the present invention will now be described with reference to the flow diagram shown in FIG. 4. Briefly, according to FIG. 4, mask data are input; the transmissive portions of the mask are divided into primitive elements; an optical system response is obtained for each primitive element, for a single coherent light source point; the responses over all primitive elements are combined to obtain an overall mask response; and finally, the light intensity is determined at the image place by combining responses over all light source points.

In more detail in step 92, mask data are input. Typically the mask data will be in GDS2 format and will specify the transmissive portions of the mask pattern.

In step 94, the transmissive portions of the mesh are divided into primitive elements. In the preferred embodiment of the invention, each polygon in the mask pattern is processed separately, as described in more detail below. In this regard, the processed polygons can be the polygons as they naturally occur in the mask pattern. In addition, polygons can result from dividing the mask into a number of windows (such as rectangular windows), which division may be performed, for example, in order to facilitate parallel processing. As a result of such division, a single polygon can be divided into two or more polygons, and those smaller polygons can be processed separately. However, it should be noted that in order to perform parallel processing, the techniques of the present invention generally will not require spatial division of the mask area. That is, separate polygons ordinarily can be processed independently using the techniques of the present invention, regardless of their relative spatial positions.

Preferably, the primitive elements are rectangles and right triangles. However, the invention is not so limited, and the primitive elements may include other geometric shapes in addition to or instead of rectangles and right triangles. For example, as noted below, the primitive elements may include polygons which can be formed as the sum of rectangles. It is also preferred that step 94 is performed by systematically making cuts in the mask pattern to divide the pattern into such primitive elements.

One example of such a technique will now be described with reference to the flow diagram shown in FIG. 5.

Figure 5:
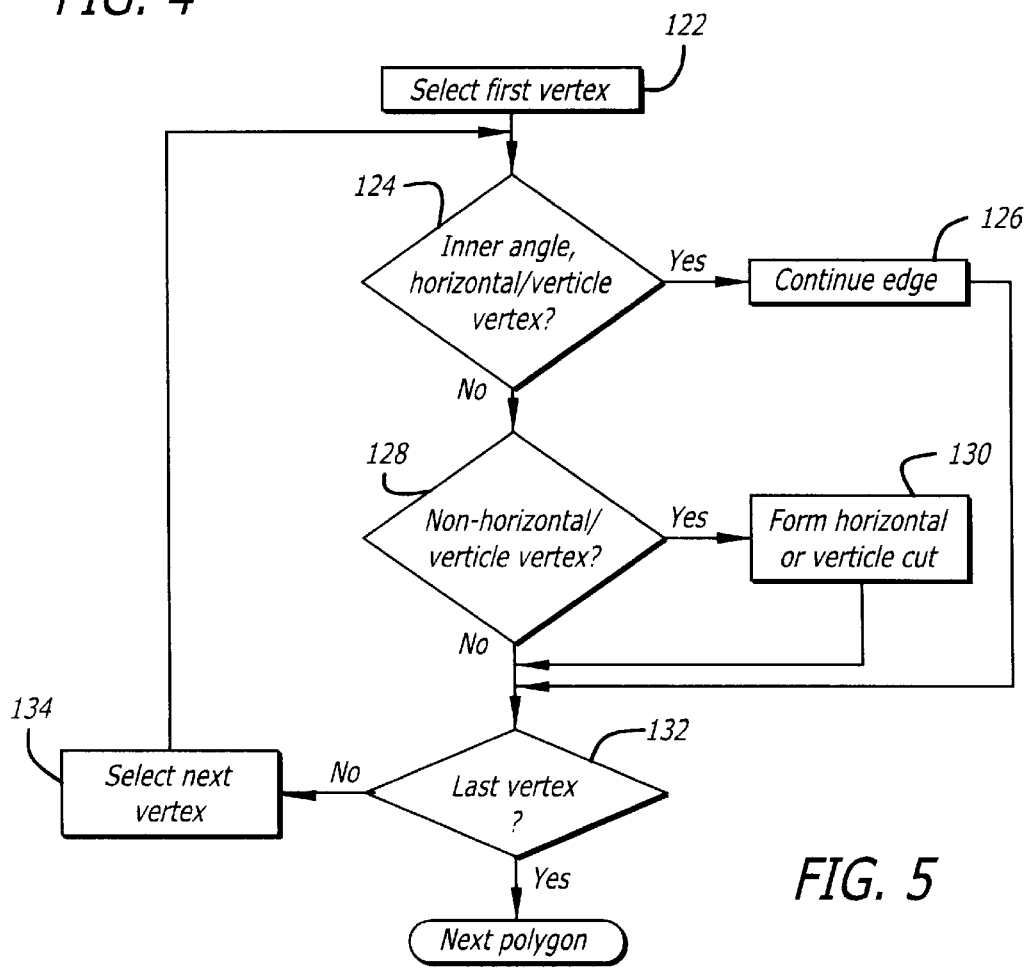
FIG. 5 is a flow diagram for explaining mask pattern decomposition according to a representative embodiment of the invention.

Specifically, FIG. 5 illustrates a flow diagram for explaining segmentation of a single polygon in the mask pattern according to a representative embodiment of the invention. The steps shown in FIG. 5 are repeated for each polygon in the mask pattern. It is noted that most polygons will consist mainly of horizontal and vertical edges, but may also consist of edges oriented at arbitrary angles. Because most of the edges are either horizontal or vertical, the method shown in FIG. 5 divides a polygon into rectangular and right triangle primitives by making horizontal and vertical cuts in the polygon.

Briefly, according to FIG. 5, the first vertex in the current polygon is selected; if the current vertex is an inner angle and is a horizontal/vertical vertex, then one of the edges forming the vertex is continued to form a cut; if the vertex is not a horizontal/vertical vertex, then a horizontal or vertical cut is made in the polygon; the foregoing steps are then repeated for each vertex while traversing the polygon in a single direction (e.g., clockwise or counter-clockwise); all of the foregoing steps are then repeated for each polygon in the mask pattern.

In more detail, in step 122, the first vertex of the current polygon is selected. In the current embodiment, the initial vertex is selected arbitrarily. However, the invention also contemplates selecting the initial vertex according to pre-defined rules in order to optimize segmentation of the polygon.

In step 124, it is determined whether the current vertex is: (1) an inner angle and (2) a horizontal/vertical vertex. With regard to (1), the vertex is an "inner angle" if continuing either edge at the vertex would extend the edge into the polygon. With regard to (2), the vertex is a "horizontal/vertical" vertex if one of the edges is horizontal and the other is vertical. As noted above, the horizontal and vertical orientations will have been decided in advance based on the predominant orientations of the edges in the mask pattern. If both of conditions (1) and (2) are true, then processing proceeds to step 126. Otherwise, processing proceeds to step 128.

In step 126, one of the horizontal and vertical edges is continued at the vertex into the polygon until either another edge or a cut is encountered. In the present embodiment, the edge to be continued is selected arbitrarily. However, the present invention also contemplates selecting the specific edge according to pre-defined rules directed at optimizing polygon segmentation.

In step 128, it is determined whether the current vertex is a non-horizontal/vertical vertex, i.e., if one of the edges is neither horizontal nor vertical. If the current vertex is a non-horizontal vertex, then processing proceeds to step 130. Otherwise processing proceeds to step 132.

In step 130, a horizontal or vertical cut is made into the polygon at the current vertex. This cut is preferably made as follows. If one of the edges is either horizontal or vertical, then (1) the edge is extended into the polygon if it can be so extended, or (2) a cut oriented 90 degrees relative to such horizontal or vertical edge is made into the polygon if such vertical or horizontal edge cannot be extended into the polygon. If neither edge is horizontal or vertical, then a horizontal or vertical cut is made at the vertex with the specific direction being selected arbitrarily. In any case, the cut is made into the polygon until either another edge or a cut is encountered. It is noted that while the foregoing technique for performing step 130 is preferred, other techniques may instead be used.

In step 132, it is determined whether the current vertex is the last vertex. If it is, then the current polygon is completed and the next polygon is selected. Otherwise, processing proceeds to step 134.

In step 134, the next vertex is selected, preferably vertexes are selected for the current polygon by traversing around the polygon in a consistent direction, such as consistently in a clockwise or consistently in a counter-clockwise direction. Upon completion of step 134, processing proceeds to step 124 to begin analyzing the new vertex to determine whether any cut should be made at that vertex.

Although the foregoing describes one technique for segmenting polygons into primitive elements, the invention is not limited only to the above-described technique. Rather, any technique may be used for segmentation of the mask pattern. In particular, the specific technique chosen may depend upon the types of primitive elements to be used.

Figure 6A:
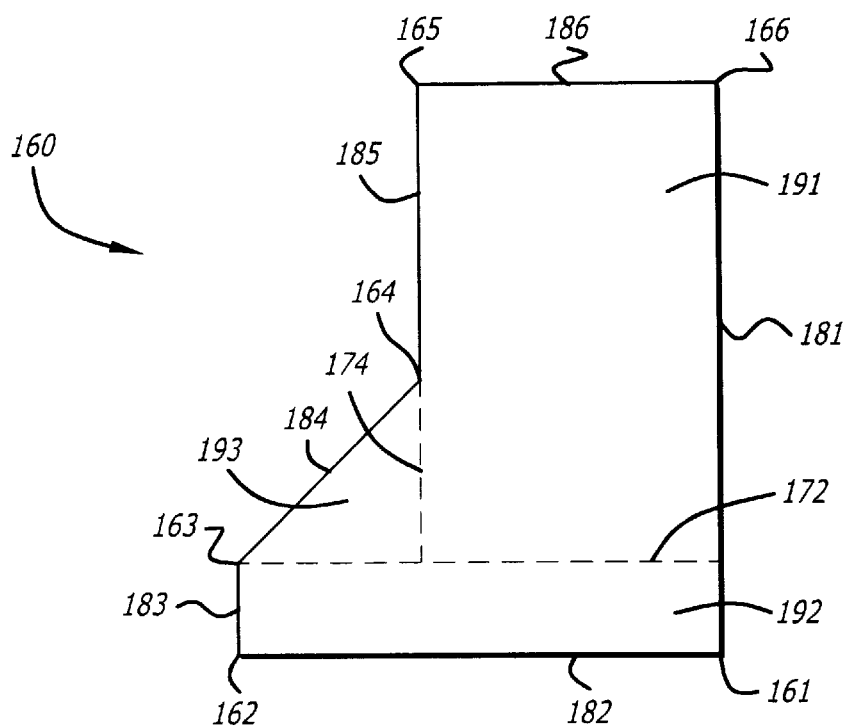
FIGS. 6A and 6B illustrate examples of mask pattern decomposition using the method shown in FIG. 5.

Examples of the foregoing method will now be given with reference to FIGS. 6A and 6B. FIG. 6A illustrates a polygon 160 which includes vertices 161 to 166. In the present example, polygon 160 is segmented by beginning at vertex 161 and proceeding in a clockwise direction. Vertex 161 is a horizontal/vertical vertex. However, vertex 161 is not an inner angle because neither of edges 181 or 182, if extended at vertex 161, would extend into polygon 160. Accordingly, no cut is made at vertex 161. The next vertex is vertex 162, which is also a horizontal/vertical vertex, but which is not an inner angle.

Next, vertex 163 is a non-horizontal/vertical vertex because edge 184 is neither horizontal nor vertical. Vertical edge 183 cannot be extended into polygon 160 at vertex 163. Accordingly, a cut 172 is made at vertex 163 with cut 172 being orthogonal to edge 183. Cut 172 continues into polygon 160 until edge 181 is encountered.

Next, vertex 164 is also a non-horizontal/vertical vertex because edge 184 is neither horizontal nor vertical. Because edge 185 is vertical and can be extended into polygon 160, a cut 174 is made into polygon 160 which extends from edge 185 and continues into polygon 160 until cut 172 is encountered.

Each of vertices 165 and 166 is a horizontal/vertical vertex, but is not an inner vertex. Accordingly, no cuts are made at those vertices. At this point, the segmentation of polygon 160 is completed. As can be seen in FIG. 6A, three primitive elements have been identified; rectangles 191 and 192 and right triangle 193.

Figure 6B:
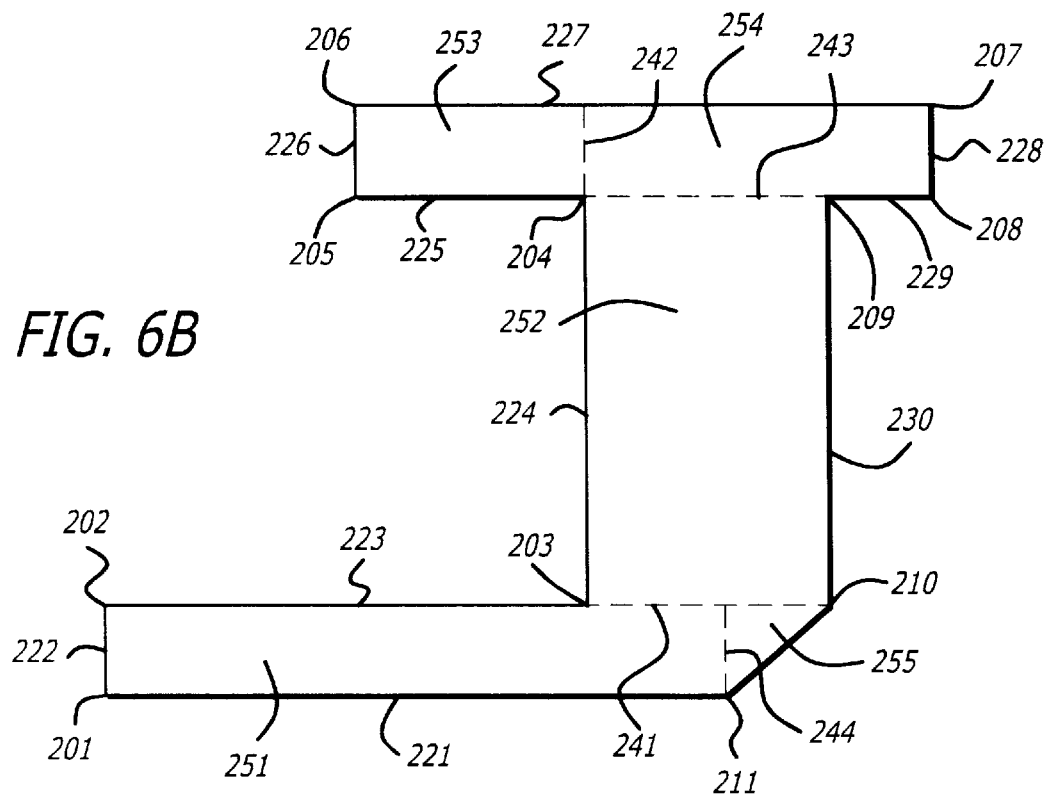

The next example concerns polygon 200 shown in FIG. 6B. Segmentation begins with vertex 201 and proceeds in a clockwise direction.

Each of vertices 201 and 202 is a horizontal/vertical vertex, but is not an inner angle. Accordingly, no cuts are made at those vertices.

Vertex 203 is a horizontal/vertical vertex. In addition, vertex 203 is an inner angle because either edge 223 or edge 224 can be extended into polygon 200. As noted above, in the current embodiment, the edge to be extended is determined arbitrarily. In the current example, edge 223 is selected because it is the first edge encountered in a clockwise direction. Accordingly, cut 241 is made by extending edge 223 into polygon 200 until edge 230 is encountered.

Next, vertex 204 is also a horizontal/vertical vertex and is an inner angle. Accordingly, edge 224 (the first encountered in a clockwise direction) is extended into polygon 200 to form cut 242, which continues until edge 227 is encountered.

Next, vertices 205, 206, 207 and 208 are all horizontal/vertical vertices, but are not inner angles. Accordingly, no cut is made at those vertices.

Next, vertex 209 is a horizontal/vertical vertex and is an inner angle. Accordingly, edge 229 (which is the first encountered in a clockwise direction) is extended into polygon 200 to form cut 243, which continues until encountering edge 224.

Next, vertex 210 is a non-horizontal/vertical vertex. Ordinarily, a cut would be made at this vertex corresponding to cut 241. However, since cut 241 has already been made, no additional cut needs to be made at this point.

Next, vertex 211 is a non-horizontal/vertical vertex. Edge 221 is a horizontal edge, but cannot be extended at vertex 211 into polygon 200. Accordingly, a cut 244 which is orthogonal to edge 221 is made at vertex 211 into polygon 200 until cut 241 is encountered.

At this point, segmentation of polygon 200 is completed. The primitive elements which make up polygon 200 include rectangles 251 to 254 and right triangle 255. It is noted that in other embodiments, additional processing may be performed to combine rectangles 253 and 254 into a single rectangle.

Returning to FIG. 4, in step 96 the optical system response is obtained for each primitive element, given a single coherent light source point. In the case of a rectangular primitive element, defined with the edges $$x=x_1=\text{const}, x=x_2=\text{const}, y=y_1=\text{const}, y=y_2=\text{const},$$

where $x_1 < x_2$ and $y_1 < y_2$, and when the mask is exposed to the monochromatic wave:

$$e^{i(k^s_x x + k^s_y y)},$$

it can be shown that the complex amplitude of the electric field at the image plane is given by:

$$H^{rect}(x, y, k_x, k_y, x_1, x_2, y_1, y_2) = \quad (4)$$

$$e^{i(k^s_x x + k^s_x y)} \sum_{v=1}^{4} s_v Z_x(x - x_v, k^s_x) Z_y(y - y_v, k^s_y)$$

where index v numerates the vertices of the rectangles; and $s_v=1$ for $x_v=x_2$ and $y_v=y_2$, $s_v=1$ for $x_v=x_2$ and $y_v=y_1$, and $s_v=-1$ elsewhere. Function $z\xi(X,k)$ depends on the type of aperture. For example, if the exit aperture is a square window with dimensions a×a, then:

$$Z_\xi(X, k) = \frac{1}{2k_m} [Si((k_m + k)X) + Si((k_m - k)X)] - \quad (5)$$

$$i[Cin((k_m + k)X) + Cin((k_m - k)X)]$$

where $k_m=a/2z$, z is the distance from exit aperture to image plane, and Si and Cin are integral sine and cosine functions, respectively, defined as follows:

$$Si(z) = \int_0^z \frac{\sin(t)}{t} dt$$

$$Cin(z) = \int_0^z \frac{1 - \cos(t)}{t} dt$$

Let us now consider an object, i.e., an element in the mask pattern, consisting of multiple rectangular primitive elements. The pattern can consists of one or several polygons, with the restriction that it can be represented as a sum of rectangles. The response of the optical system to this pattern can be represented as a sum of products of the form: $s_v Z_x(x-x_v, k^s_x) Z_y(y-y_v, k^s_y)$ taken over all vertices of the rectangles.

Generally, many of the vertices of the component rectangles will be common to several different rectangles. Using the previously introduced sign convention, most of the sum terms can be canceled out. For example, if vertices of four of the rectangles meet at a certain point, the total contribution from that point is equal to zero. Consequently, all the vertices that fall inside the pattern are excluded from the sum, as is each vertex that belong to a single straight edge in the composite mask pattern element. What finally remains in the sum are only those rectangle vertices that are also vertices of the composite element.

Now, a formula for determining the light field at the resist plane due to a composite element consisting of rectangles in the mask plane is:

$$H(x, y, k^s_x, k^s_y) = e^{i(k^s_x x + k^s_y y)} \sum_{\text{all-vertices}} S_v Z_x(x - x_v, k^s_x) Z_y(y - y_v, k^s_y) \quad (6)$$

Equation (6) thus illustrates that the manner of decomposing an element into rectangles generally is irrelevant and that the optical system response to a polygon comprised of rectangles can be determined without decomposing the polygon into rectangles. Thus, any polygons which can be decomposed into rectangles can be easily used as primitive elements in the present invention. Similarly, equation (6) can be utilized in a pre-processing routine to reduce the number of rectangular vertices that need to be considered when determining responses to rectangular primitives in step 98.

Figure 7:
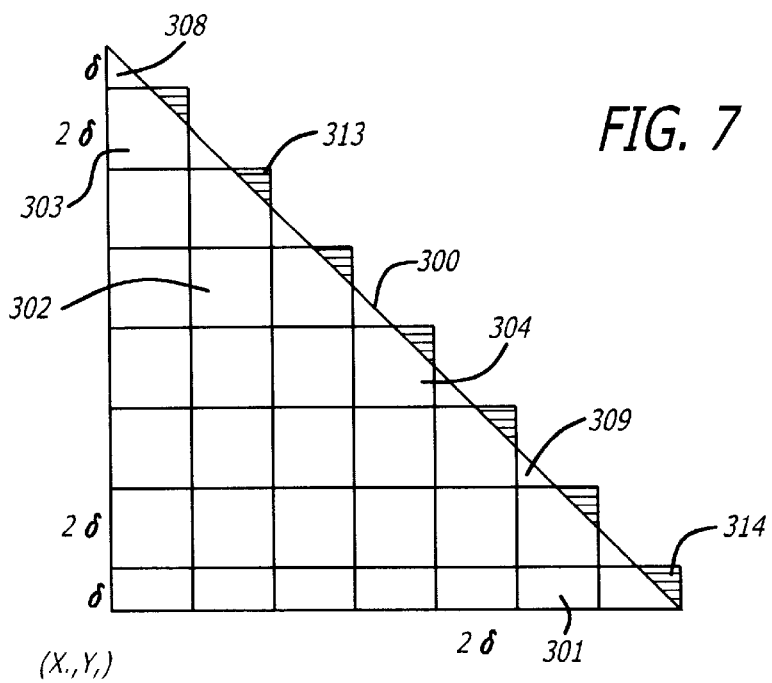
FIG. 7 illustrates how to determine an optical system response to a right triangular primitive element according to the preferred embodiment of the invention.

Referring to FIG. 7, The procedure for determining the optical system response to a right triangular primitive element 300 of arbitrary dimensions preferably is as follows:

1. The right triangular primitive element 300 is described by the coordinates of its right angle $(x_1,y_1)$ and the length of its sides, as illustrated in FIG. 7. In the present example it will be assumed that right triangular primitive element 300 is an isosceles triangle, although it should be noted that triangular primitives according to the present invention are not limited to isosceles triangles.

2. Triangular primitive element 300 is decomposed into a number of rectangles and smaller triangles, as illustrated in FIG. 7. As shown in FIG. 7, right triangle 300 is comprised of rectangles, such as rectangles 301 to 304, and smaller triangles. These smaller triangles include positive triangles whose responses are added to those of the rectangles, such as positive triangles 308 and 309, and negative triangles whose responses are subtracted from those of the rectangles, such as negative triangles 313 and 314. The dimensions of these rectangles and smaller triangles is shown in FIG. 7, where δ=a/L, a is the length of a side of the triangle, and L is an integer. The optical system response is now given as the sum of the responses of the rectangles and smaller triangles, as follows:

$$H^{triangle}(x, y, k^s_x, k^s_y, x_1, y_1, a) = \quad (7)$$

$$\sum_{m=0}^{L-1} H^{rect}(x, y, k^s_x, k^s_y, x_1 + 2m\delta, x_1 + 2(m+1)\delta,$$

$$y_1 + (a - \delta) - 2m\delta, y_1) + \sum_{m=0}^{L-1} H^{PTriang}$$

3. The term that corresponds to the rectangles, according to equation (6) above, can be transformed into the following form:

$$\sum_{m=0}^{L-1} H^{rect} = \frac{e^{i(k_x^s x + k_y^s y)}}{4k_{mx}k_{my}} \left[ Z_y(y_1, k_y^s)[Z_x(x_1, k_x^s) - Z_x(x_1 + 2L\delta, k_x^s)] + \right.$$

$$\left. \sum_{m=0}^{L-1} Z_y(y_1 + (a-\delta) - 2m\delta, k_y^s)[Z_x(x_1 + 2(m+1)\delta, k_x^s) - Z_x(x_1 + 2m\delta, k_x^s)] \right] \quad (8)$$

4. It can be shown that the relative contribution of the smaller triangles to the optical system response to the right triangular primitive element is less than $10^{-3}$ of the total response when a right triangle with sides equal to $\lambda$ (the wavelength of the incident light) is represented with 16 rectangles.

5. When higher precision is necessary, for smaller triangles with dimensions less than $\lambda$, the contribution of the smaller triangles can be given as:

$$H_1^{triangle}(x, y, k_x^s, k_y^s, x_1, y_1, a) = \quad (9)$$

$$\frac{e^{i(k_x^s x + k_y^s y)}}{4k_m^2} \{Z(y - y_1, k_y^s)[Z(x - x_1, k_x^s) - Z(x - (x_1 + a), k_x^s)]\} +$$

$$J\Delta(x - x_1, y - y_1 - a, k_x^s, k_y^s, a) \}$$

where $$J\Delta(x, y, k_x^s, k_y^s, a) = \int_0^a Z'(x_1 - \xi, k_x^s) Z'(y_1 - \xi, k_y^s) d\xi \quad (10)$$

and Z' denotes the first derivative of Z over the first argument.

To calculate $J\Delta$, the Gauss quadratic formula is used, as follows:

$$J\Delta(x, y, k_x^s, k_y^s, a) = \frac{a}{2} \sum_{k=1}^{n} A_k^{(n)} F(\eta = X_k^{(n)}) \quad (11)$$

where $$F(\eta) = Z'(x - \xi(\eta), k_x^s) Z'(y - \xi(\eta), k_y^s), \xi(\eta) = a/2(\eta+1), x_k^{(n)}$$

are the zeros of Legendre polynomials, and $A_k^{(n)}$ are the coefficients of the Gauss quadratic formula.

While the foregoing technique is utilized to determine optical system response to triangular primitive elements in the preferred embodiment of the invention, it should be noted that other techniques also may be used. Moreover, as noted above, other types of primitive elements also may be used. Also, rather than calculating the response to the primitive elements in step 96, responses may be pre-stored for standard primitive elements and then simply retrieved from memory in step 96. Pre-storing responses to standard primitive elements may increase simulation processing speed, as well as providing the opportunity to use primitive elements for which closed form response equations can not be derived or for which responses are difficult to calculate on-the-fly.

Returning to FIG. 4, in step 98 the responses from all primitive elements are combined to obtain an overall mask response function. Preferably, this step is performed simply by summing the responses for all primitive elements identified in step 94. In the present embodiment, the overall mask response function is thus given as:

$$H(x, y, k_x^s, k_y^s) = \quad (12)$$

$$\sum_{all\text{-}rect} H^{rect}(x, y, k_x^s, k_y^s) + \sum_{all\text{-}triang} H^{triangle}(x, y, k_x^s, k_y^s)$$

In step 100, the light intensity at the image plane is determined by combining the responses over all light source points. Preferably, this step is performed by integrating over all points of light source using the following expression:

$$I(x,y) = \int S_B(k_x^s, k_x^s) |H(x,y,k_x^s,k_x^s)|^2 dk_x^s dk_y^s \quad (13)$$

where $S_B(k_x^s, k_y^s)$ is the Fourier transform of the two-point coherence function.

For example, for a light source with a circular aperture, uniform distribution and coherence parameter $\sigma$[3], $S_B$ is known to be:

$$S_B = \begin{cases} \frac{1}{\pi(k\sigma)^2} & \text{for } (k_x^s)^2 + (k_y^s)^2 \leq (k\sigma)^2 \\ 0 & \text{elsewhere} \end{cases} \quad (14)$$

where $k = 2\pi/\lambda$.

In the preferred embodiment of the geometric aerial simulation, transmissive portions of the mask are divided into primitive elements, responses for the primitive elements are determined, and then an overall mask response is determined. In the foregoing embodiment, the responses of all primitive elements to a single point light source are summed and then the responses are evaluated and combined over all light source points. However, it should be understood that this particular order is not strictly necessary. Instead, steps 98 and 100 can be interchanged or can be combined into a single step.

By dividing mask transmissive portions into primitive elements, obtaining responses for those primitive elements, and then determining the overall mask response based on the responses from the primitive elements, the present invention often can avoid many of the problems with the prior art techniques. Specifically, the geometric aerial image simulation technique of the present invention generally can avoid the need to rasterize the mask pattern, thereby avoiding rasterization errors. At the same time, the present technique often can be performed relatively quickly. In this regard, as noted above, in many instances the response of a primitive element can be found using only the vertices of the primitive element. In addition, if standard primitive elements are used, the primitive element responses can be pre-stored, thus further reducing the amount of time required to simulate an aerial image.

Finally, by utilizing a geometric aerial image simulation technique according to the present invention, it is often much easier to calculate light intensity only in a small arbitrarily selected portion of the image plane. Conventional techniques, by contrast, often use FFT-based algorithms generally require simulation of the entire image plane. This can be a great advantage of the present technique, because it is frequently only desirable to know light intensity in certain selected portions of the image plane, such as near feature edges.

B. Hybrid Aerial Image Simulation

Figure 8:
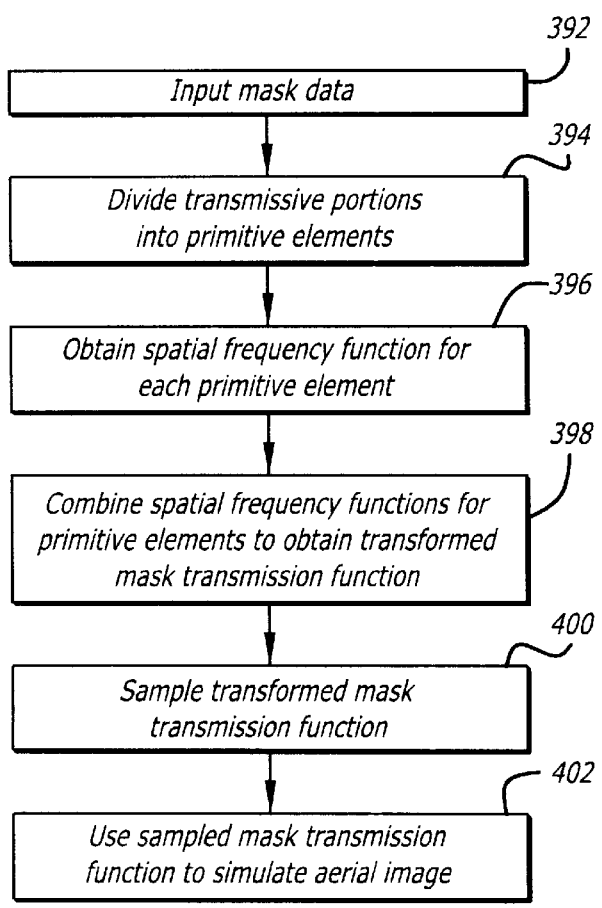
FIG. 8 is a flow diagram for explaining hybrid aerial image simulation according to a preferred embodiment of the invention.

An embodiment of a hybrid aerial image simulation technique according to the present invention will now be described with reference to the flow diagram shown in FIG. 8. Briefly, according to FIG. 8, the mask pattern data are input; the transmissive portions of the mask pattern are divided into primitive elements; a spatial frequency function is obtained for each primitive element; the spatial frequency functions are combined to obtained a transformed mask transmission function; the transformed mask transmission function is sampled based on the desired image plane mesh; and the sampled mask transmission function is then used to simulate the aerial image.

In more detail, in step 392, the mask pattern data are input. Typically, the transmissive portions of the mask pattern are specified in GDS2 format.

In step 394, the transmissive portions of the mask pattern data are divided into primitive elements. Preferably, the primitive elements are rectangles and right triangles. However, as discussed above, other types of primitive elements may instead be used. More preferably, this step is performed in the same manner as step 94 (shown in FIG. 4 above).

Figure 9A:
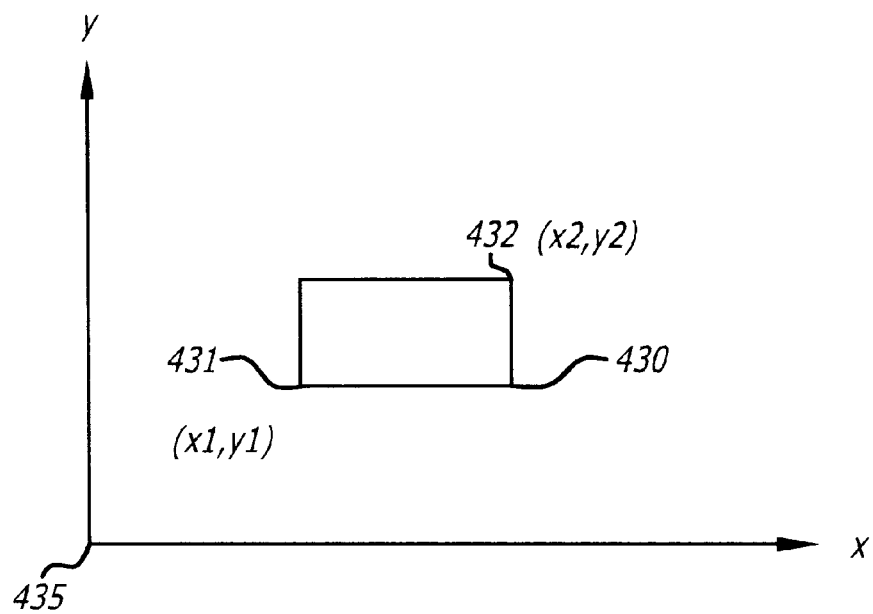
FIGS. 9A and 9B illustrate a rectangular primitive element and a triangular primitive element, respectively.

In step 396, a spatial frequency function is obtained for each of the primitive elements. Preferably, the spatial frequency functions are Fourier transforms of the corresponding primitive elements. However, the spatial frequency functions instead may be obtained using other types of transformations, such as by using a cosine transformation. Also, as noted above, it is preferable that the primitive elements are rectangles and triangles. For an arbitrary rectangle, such as rectangle 430 shown in FIG. 9A, it can be shown that the Fourier transform is given as follows:

$$F(\xi, \eta) = \Delta x \frac{\operatorname{Sin}\left(\lambda \frac{\Delta x}{2}\xi\right)}{\left(\lambda \frac{\Delta x}{2}\xi\right)} \cdot \Delta y \frac{\operatorname{Sin}\left(\lambda \frac{\Delta y}{2}\eta\right)}{\left(\lambda \frac{\Delta y}{2}\eta\right)} \cdot \exp\{i\lambda(x_0\xi + y_0\eta)\} \quad (15)$$

where (x1,y1) are the coordinates of the lower left corner 431 of rectangle 430, (x2,y2) are the coordinates of the upper right corner 432 of rectangle 430, λ is the wavelength of the incident light, and the transmission function equals 1 within the rectangle and 0 outside the rectangle. Origin 435 can be arbitrarily located; however, it is preferable that origin 435 be fixed relative to the mask for all primitive elements, in order to avoid application of relative phase shifts in step 398. It is noted that, in the present embodiment of the invention, the edges of the rectangular primitive elements will be parallel to the x and y axes. Accordingly, equation (15) above can be used to find the Fourier transform of any rectangular primitive element. If arbitrarily oriented rectangles are intended to be used as primitive elements, a more general formulation of the Fourier transform will have to be used.

Figure 9B:
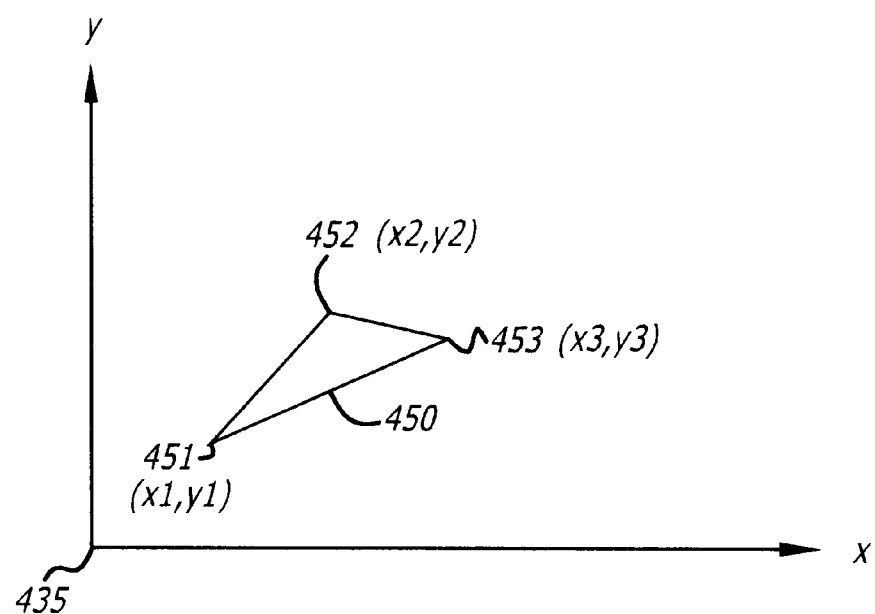

For an arbitrary triangle, such as triangle 450 shown in FIG. 9B, it can be shown that the Fourier transform is given as follows:

$$F(\xi, \eta) = -\frac{1}{\lambda^2 \eta} \left\{ \frac{1}{\xi + k_{01}\eta} [e^{i\lambda[(\xi+k_{01}\eta)x_1 + \eta b_{01}]} - e^{i\lambda[(\xi+k_{01}\eta)x_0 + \eta b_{01}]}] + \frac{e^{i\lambda\eta b_{12}}}{\xi + k_{12}\eta} [e^{i\lambda(\xi+k_{12}\eta)x_2} - e^{i\lambda(\xi+k_{12}\eta)x_1}] + \frac{e^{i\lambda\eta b_{02}}}{\xi + k_{02}\eta} [e^{i\lambda(\xi+k_{02}\eta)x_0} - e^{i\lambda(\xi+k_{02}\eta)x_2}] \right\} \quad (16)$$

where $$k_{01} = \frac{y_1 - y_0}{x_1 - x_0}; b_{01} = y_0 - k_{01} \cdot x_0;$$

$$k_{12} = \frac{y_2 - y_1}{x_2 - x_1}; b_{12} = y_1 - k_{12}x_1;$$

$$k_{02} = \frac{y_2 - y_0}{x_2 - x_0}; b_{02} = y_2 - k_{02}x_2;$$

and where (x1,y1), (x2,y2) and (x3,y3) are the coordinates of the three triangle vertices 451 to 453, respectively; λ is the wavelength of the incident light; and the transmission function equals 1 within the triangle and 0 outside the triangle. As noted above, origin 435 can be placed arbitrarily, but preferably is positioned the same relative to the mask for all primitive elements.

Thus, in the preferred embodiment, the spatial frequency functions for the primitive elements are calculated analytically on-the-fly. However, it should be noted that it is also possible to calculate these functions using a discrete transformation such as the FFT or the Discrete Cosine Transformation (DCT). This may be desirable, for example, where at least some of the primitive elements have complicated shapes for which an analytical transformation cannot be easily determined. In this case, it may be possible to use a finer mesh than could be used if, for example, the entire mask pattern had to be transformed using the FFT. Also, if standard primitive elements are used, the spatial frequency transformations generally can be pre-stored.

In step 398, the spatial frequency functions for the primitive elements making up the mask pattern are combined to obtain the transformed mask transmission function. In the preferred embodiment, in which equations (15) and (16) are used to determine the primitive elements' spatial frequency transformations, and assuming that the same origin 435 is used for all primitive elements, this step merely involves adding the spatial frequency functions for the primitive elements. Thus, the transformed mask transmission function is given as follows:

$$F_U(\vec{p}) = \sum_{l=1}^{L} F_{rect_l}(\vec{p}) + \sum_{p=1}^{P} F_{triang_p}(\vec{p}) \quad (17)$$

However, if spatial frequency functions are pre-stored, or if different origins are used for different primitive elements, it may be necessary to multiply some or all of the spatial frequency functions for the primitive elements by an appropriate phase shift, in order to reflect their relative positions in the mask, prior to adding them.

In step 400, the transformed mask transmission function is sampled. The sampling step size generally can be independent of the mask features and, in particular, independent of the mask feature sizes. Instead, the step size can be chosen based on the desired resolution in the image plane and based on the limitations of the optical system. In this latter regard, the step size generally should be not larger than:

$$\frac{\lambda}{2NA(1+\sigma)} \quad (18)$$

where $\lambda$ is the wavelength of the incident light, NA is the numerical aperture of the optical system, and $\sigma$ is the coherence parameter of the light source.

Finally, in step 402 the sampled mask transmission function is used to simulate the aerial image. In the preferred embodiment of the invention, this step is performed by combining the mask transmission function with the optical system coherent transmission function, performing an inverse spatial frequency transformation, and then evaluating over all light source points, such as according to equation (2) above. More preferably, equation (2) is evaluated using a number of processors to separately simulate portions of the aerial image, such as using the following technique.

First, the aerial image plane is divided into a number of non-overlapping rectangles. Then, the aerial image is evaluated in each such rectangle by dividing the mask plane into a number of rectangles, where the area of each rectangle in the mask plane is primarily responsible for the portion of the 1S aerial image in a corresponding rectangle in the aerial image plane. Generally, such rectangles in the mask plane will be larger than their corresponding rectangles in the image plane, and therefore will have to overlap. For example, if light is incident on the mask plane at 90 degrees, the rectangles in the mask plane will be directly above the corresponding rectangles in the aerial image plane, but generally will be larger than the rectangles in the aerial image plane. It is preferable that the rectangles in the mask plane have dimensions of approximately twice the dimensions of the rectangles in the image plane. Generally, accurate results can be obtained by using rectangles in the mask plane having dimensions of at least $2\lambda/(NA)$ with corresponding rectangles in the aerial image plane being the center rectangles of those in the mask plane and having dimensions of $\lambda/(NA)$, where $\lambda$ is the wavelength of the incident light and NA is the numerical aperture.

While the above describes a representative embodiment of hybrid simulation according to the present invention, numerous variations are possible. For example, sampling step 400 could be performed prior to combining step 398. Also, other simulation formulas may be used in step 402.

Hybrid aerial image simulation according to the present invention can be used in mask design, such as in step 44 (shown in FIG. 2). After aerial image simulation, it may be desirable to alter the mask pattern by adding or replacing correction elements, such as serifs. See, for example, step 50 shown in FIG. 2 above. In the event of such mask alteration, the new transformed mask transmission function can be easily calculated using the present hybrid technique. Specifically, the new transformed mask transmission function is the previous mask transmission function plus the sum of the spatial frequency transformations of the new correction elements minus the sum of the spatial frequency transformations of the replaced correction elements. Mathematically, this is given as follows:

$$F_{U_{new}}(\vec{p}) = F_{U_{prev}}(\vec{p}) + \sum_{j=1}^{J} F_{corr_{new}} - \sum_{k=1}^{K} F_{corr_{repl}} \quad (19)$$

It is noted that the spatial frequency functions of the correction elements can be determined in the same manner as described above for the primitive elements.

Thus, the hybrid aerial image simulation according to the present invention generally can avoid many of the problems associated with conventional techniques. First, rasterization errors which are present in many conventional techniques can be largely eliminated. Second, a relatively coarse FFT mesh often can be utilized, increasing computation speed while still maintaining good accuracy. Third, the present technique generally permits relatively easy calculation of the effects of adding or replacing correction elements on the resulting aerial image. Fourth, because simulation accuracy generally is unrelated to mask feature size in the present technique, it is usually possible to calculate the effects of small correction elements, i.e., having dimensions much smaller than the resolution of the optical system.

C. Aerial Image Simulation System Environment

Generally, the methods described herein, or portions thereof, will be practiced with a general purpose computer, either with a single processor or multiple processors. For example, a mask pattern can be input and the foregoing steps for simulating an aerial image can then be performed by a computer.

Figure 10:
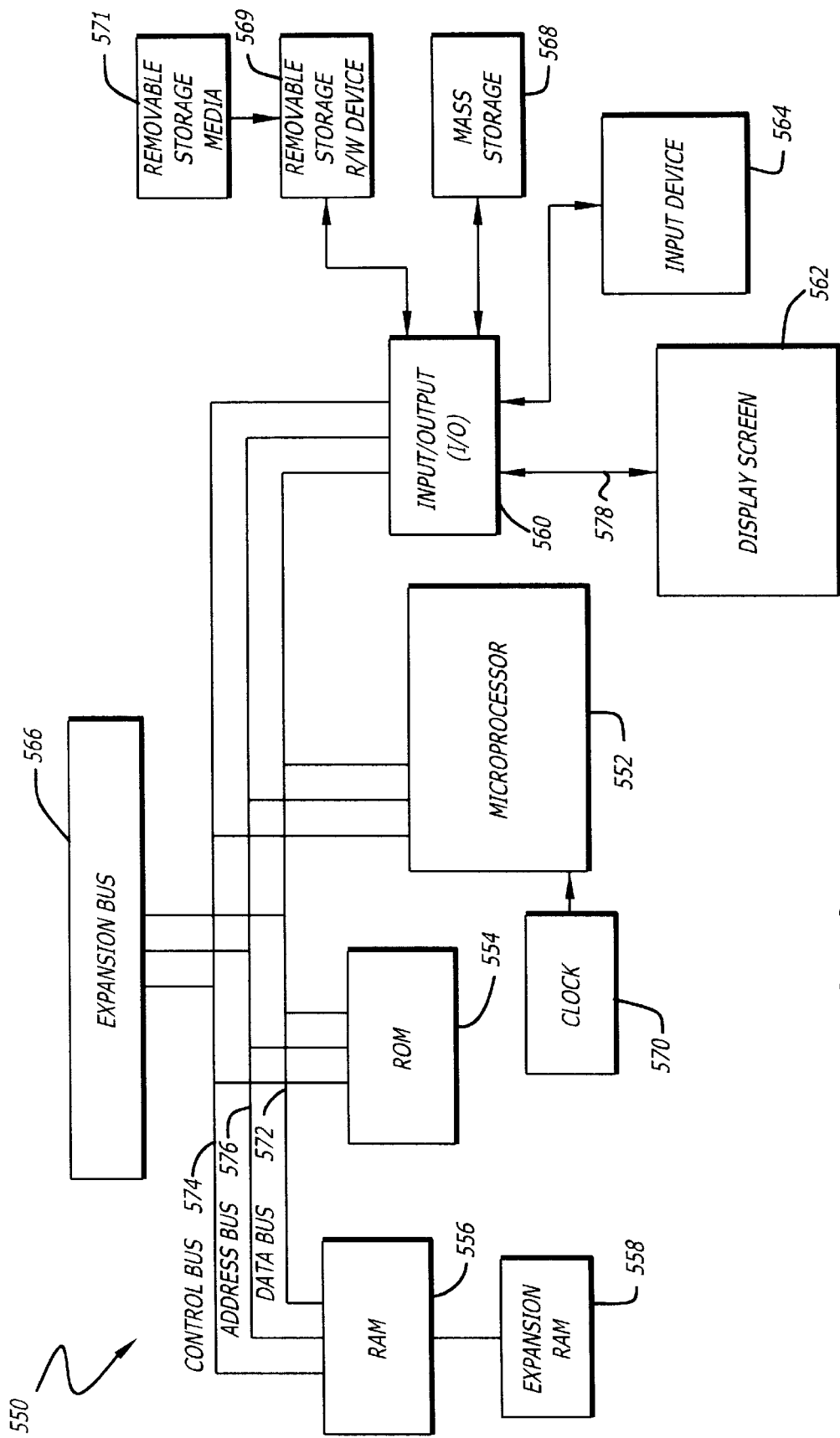
FIG. 10 illustrates a block diagram of a general purpose computer which is one suitable platform for implementing the methods of the present invention.

FIG. 10 is an illustration of a general purpose computer system, representing one of many suitable computer platforms for implementing the inventive methods described above. FIG. 10 shows a general purpose computer system 550 in accordance with the present invention includes a central processing unit (CPU) 552, read only memory (ROM) 554, random access memory (RAM) 556, expansion RAM 558, input/output (I/O) circuitry 560, display assembly 562, input device 564, and expansion bus 566. Computer system 550 may also optionally include a mass storage unit 568 such as a disk drive unit or nonvolatile memory such as flash memory and a real-time clock 570.

CPU 552 is coupled to ROM 554 by a data bus 572, control bus 574, and address bus 576. ROM 554 contains the basic operating system for the computer system 550. CPU 552 is also connected to RAM 556 by busses 572, 15 574, and 576. Expansion RAM 558 is optionally coupled to RAM 556 for use by CPU 552. CPU 552 is also coupled to the I/O circuitry 560 by data bus 572, control bus 574, and address bus 576 to permit data transfers with peripheral devices.

I/O circuitry 560 typically includes a number of latches, registers and direct memory access (DMA) controllers. The purpose of I/O circuitry 560 is to provide an interface between CPU 552 and such peripheral devices as display assembly 562, input device 564, and mass storage 568.

Display assembly 562 of computer system 550 is an output device coupled to I/O circuitry 560 by a data bus 578. Display assembly 562 receives data from I/O circuitry 560 via bus 578 and displays that data on a suitable screen.

The screen for display assembly 562 can be a device that uses a cathode-ray tube (CRT), liquid crystal display (LCD), or the like, of the types commercially available from a variety of manufacturers. Input device 564 can be a keyboard, a mouse, a stylus working in cooperation with a position-sensing display, or the like. The aforementioned input devices are available from a variety of vendors and are well known in the art.

Some type of mass storage 568 is generally considered desirable. However, mass storage 568 can be eliminated by providing a sufficient mount of RAM 556 and expansion RAM 558 to store user application programs and data. In that case, RAMs 556 and 558 can optionally be provided with a backup battery to prevent the loss of data even when computer system 550 is turned off. However, it is generally desirable to have some type of long term mass storage 568 such as a commercially available hard disk drive, nonvolatile memory such as flash memory, battery backed RAM, PC-data cards, or the like.

A removable storage read/write device 569 may be coupled to I/O circuitry 560 to read from and to write to a removable storage media 571. Removable storage media 571 may represent, for example, a magnetic disk, a magnetic tape, an opto-magnetic disk, an optical disk, or the like. Instructions for implementing the inventive method may be provided, in one embodiment, to a network via such a removable storage media.

In operation, information is inputted into the computer system 550 by typing on a keyboard, manipulating a mouse or trackball, or "writing" on a tablet or on position-sensing screen of display assembly 562. CPU 552 then processes the data under control of an operating system and an application program stored in ROM 554 and/or RAM 556. CPU 552 then typically produces data which is outputted to the display assembly 562 to produce appropriate images on its screen.

Expansion bus 566 is coupled to data bus 572, control bus 574, and address bus 576. Expansion bus 566 provides extra ports to couple devices such as network interface circuits, modems, display switches, microphones, speakers, etc. to CPU 552. Network communication is accomplished through the network interface circuit and an appropriate network.

Suitable computers for use in implementing the present invention may be obtained from various vendors. Various computers, however, may be used depending upon the size and complexity of the tasks. Suitable computers include mainframe computers, multiprocessor computers, workstations, or personal computers. In addition, although a general purpose computer system has been described above, a special-purpose computer may also (or instead) be used to implement the methods of the present invention.

It should be understood that the present invention also relates to machine readable media on which are stored program instructions for performing methods of this invention. Such media includes, by way of example, magnetic disks, magnetic tape, optically readable media such as CD ROMs, semiconductor memory such as PCMCIA cards, etc. In each case, the medium may take the form of a portable item such as a small disk, diskette, cassette, etc., or it may take the form of a relatively larger or immobile item such as a hard disk drive or RAM provided in a computer.

D. Conclusion

Although the present invention has been described in detail with regard to the exemplary embodiments and drawings thereof, it should be apparent to those skilled in the art that various adaptations and modifications of the present invention may be accomplished without departing from the spirit and the scope of the invention. Accordingly, the invention is not limited to the precise embodiments shown in the drawings and described in detail above. Therefore, it is intended that all such variations not departing from the spirit of the invention be considered as within the scope thereof as limited solely by the claims appended hereto.

In the following claims, those elements which do not include the words "means for" are intended not to be interpreted under 35 U.S.C. §112 ¶6.

What is claimed is:

1. A method of simulating an aerial image produced by a mask having transmissive portions when said mask is exposed to a light source, said method comprising:
 (a) dividing the transmissive portions of the mask into primitive elements;
 (b) obtaining a response function for each of the primitive elements;
 (c) summing the response functions for all of the primitive elements to obtain a mask response function; and
 (d) simulating the aerial image by evaluating the mask response function over all points in the light source.

2. A method according to claim 1, wherein each response function is a function of a variable relating to a position of a point in the light source.

3. A method according to claim 1, wherein the response function for each primitive element corresponds to an image that would be produced by said each primitive element if illuminated by a point in the light source.

4. A method according to claim 1, wherein at least two of the primitive elements have different shapes.

5. A method according to claim 1, wherein the primitive elements include at least one rectangle and at least one triangle.

6. A method according to claim 1, wherein the primitive elements include polygons that can be represented by a sum of rectangles, and wherein difficulty in determining a response function for each of the polygons is based on a number of vertices in said each of the polygons.

7. A method according to claim 1, wherein a response function for a triangular primitive element is obtained by decomposing the triangular primitive element into a set of rectangles and smaller triangles.

8. A method according to claim 1, wherein response functions for standard primitive elements are pre-stored.

9. A method according to claim 1, wherein the response function obtained in step (b) is specified in a spatial domain.

10. A method according to claim 1, wherein the aerial image can be simulated for an arbitrarily selected portion of an image plane, and wherein difficulty of simulation is dependent upon a size of the arbitrarily selected portion of the image plane.

11. A method of simulating an aerial image produced by a mask having transmissive portions when said mask is exposed to a light source, said method comprising:
 (a) dividing the transmissive portions of the mask into primitive elements;
 (b) obtaining a response for each of the primitive elements when said each of the primitive elements is exposed to a single point in the light source; and
 (c) simulating the aerial image by combining the responses over all of the primitive elements and over all points in the light source.

12. A method according to claim 11, wherein at least two of the primitive elements have different shapes.

13. A method according to claim 11, wherein the primitive elements include at least one rectangle and at least one triangle.

14. A method according to claim 11, wherein the primitive elements include polygons that can be represented by a sum of rectangles, and wherein difficulty in determining a response for each of the polygons in step (b) is based on a number of vertices in said each of the polygons.

15. A method according to claim 11, wherein a response for a triangular primitive element is obtained by decomposing the triangular primitive element into a set of rectangles and smaller triangles.

16. A method according to claim 11, wherein responses for standard primitive elements are pre-stored.

17. A method according to claim 11, wherein the aerial image can be simulated for an arbitrarily selected portion of an image plane, and wherein difficulty of simulation is dependent upon a size of the arbitrarily selected portion of the image plane.

18. A method according to claim 11, wherein the response obtained in step (b) is specified in a spatial domain.

19. A method of simulating an aerial image produced by a mask having transmissive portions, said method comprising:
   (a) dividing the transmissive portions of the mask into primitive elements;
   (b) obtaining a response for each of the primitive elements; and
   (c) simulating the aerial image for an arbitrarily selected portion of an image plane by combining the responses over all of the primitive elements.

20. A method according to claim 19, wherein at least two of the primitive elements have different shapes.

21. A method according to claim 19, A method according to claim 19, wherein responses for standard primitive elements are pre-stored.

22. A method according to claim 19, wherein difficulty of simulation is dependent upon a size of the arbitrarily selected portion of the image plane.

23. A method according to claim 19, wherein the response obtained in step (b) is specified in a spatial domain.

24. Computer-executable process steps stored on a computer readable medium, said process steps for simulating an aerial image produced by a mask having transmissive portions when said mask is exposed to a light source, said process steps comprising steps to:
   (a) divide the transmissive portions of the mask into primitive elements;
   (b) obtain a response function for each of the primitive elements;
   (c) sum the response functions for all of the primitive elements to obtain a mask response function; and
   (d) simulate the aerial image by evaluating the mask response function over all points in the light source.

25. Computer-executable process steps stored on a computer readable medium, said process steps for simulating an aerial image produced by a mask having transmissive portions when said mask is exposed to a light source, said process steps comprising steps to:
   (a) divide the transmissive portions of the mask into primitive elements;
   (b) obtain a response for each of the primitive elements when said each of the primitive elements is exposed to a single point in the light source; and
   (c) simulate the aerial image by combining the responses over all of the primitive elements and over all points in the light source.

26. Computer-executable process steps stored on a computer readable medium, said process steps for simulating an aerial image produced by a mask having transmissive portions, said process steps comprising steps to:
   (a) divide the transmissive portions of the mask into primitive elements;
   (b) obtain a response for each of the primitive elements; and
   (c) simulate the aerial image for an arbitrarily selected portion of an image plane by combining the responses over all of the primitive elements.

27. An apparatus for simulating an aerial image produced by a mask having transmissive portions when said mask is exposed to a light source, said apparatus comprising:
   a processor for executing stored program instruction steps; and
   a memory connected to the processor for storing the program instruction steps,
   wherein the program instruction steps include steps to:
      (a) divide the transmissive portions of the mask into primitive elements;
      (b) obtain a response function for each of the primitive elements;
      (c) sum the response functions for all of the primitive elements to obtain a mask response function; and
      (d) simulate the aerial image by evaluating the mask response function over all points in the light source.

28. An apparatus for simulating an aerial image produced by a mask having transmissive portions when said mask is exposed to a light source, said apparatus comprising:
   a processor for executing stored program instruction steps; and
   a memory connected to the processor for storing the program instruction steps,
   wherein the program instruction steps include steps to:
      (a) divide the transmissive portions of the mask into primitive elements;
      (b) obtain a response for each of the primitive elements when said each of the primitive elements is exposed to a single point in the light source; and
      (c) simulate the aerial image by combining the responses over all of the primitive elements and over all points in the light source.

29. An apparatus for simulating an aerial image produced by a mask having transmissive portions, said apparatus comprising:
   a processor for executing stored program instruction steps; and
   a memory connected to the processor for storing the program instruction steps,
   wherein the program instruction steps include steps to:
      (a) divide the transmissive portions of the mask into primitive elements;
      (b) obtain a response for each of the primitive elements; and
      (c) simulate the aerial image for an arbitrarily selected portion of an image plane by combining the responses over all of the primitive elements.

* * * * *